United States Patent
Kanno et al.

[11] Patent Number: 5,918,817
[45] Date of Patent: Jul. 6, 1999

[54] TWO-FLUID CLEANING JET NOZZLE AND CLEANING APPARATUS, AND METHOD UTILIZING THE SAME

[75] Inventors: Itaru Kanno, Tokyo; Masuo Tada; Mitsuhiro Ogawa, both of Osaka, all of Japan

[73] Assignees: Mitsubishi Denki Kabushiki Kaisha, Tokyo, Japan; Taiyo Toyo Sanso Co., Ltd., Osaka, Japan

[21] Appl. No.: 08/893,683

[22] Filed: Jul. 11, 1997

[30] Foreign Application Priority Data

Dec. 2, 1996 [JP] Japan .................................... 8-321963

[51] Int. Cl.$^6$ ....................................................... B05B 7/04
[52] U.S. Cl. ...................... 239/433; 239/434; 239/434.5; 239/423; 239/427
[58] Field of Search ................................... 239/433, 434, 239/434.5, 423, 427, 429

[56] References Cited

U.S. PATENT DOCUMENTS

| | | | |
|---|---|---|---|
| 1,562,194 | 11/1925 | Schaefer | 239/433 |
| 1,894,879 | 1/1933 | Lay | 239/433 |
| 2,331,421 | 10/1943 | Redhead | 239/521 |
| 4,666,083 | 5/1987 | Yie | 239/433 |
| 4,787,404 | 11/1988 | Klosterman et al. | |
| 4,815,241 | 3/1989 | Woodson | 239/433 |
| 4,989,788 | 2/1991 | Bendig et al. | |
| 5,035,090 | 7/1991 | Szucs | 239/433 |
| 5,129,583 | 7/1992 | Bailey et al. | |
| 5,462,605 | 10/1995 | Szuecs | |
| 5,725,154 | 3/1998 | Jackson | 239/135 |

FOREIGN PATENT DOCUMENTS

| | | |
|---|---|---|
| 49-101913 | 9/1974 | Japan . |
| 60-153981 | 8/1985 | Japan . |
| 64-34458 | 2/1989 | Japan . |
| 7-80357 | 3/1995 | Japan . |
| 7-124503 | 5/1995 | Japan . |
| 8-89911 | 4/1996 | Japan . |

*Primary Examiner*—Andres Kashnikow
*Assistant Examiner*—David Deal
*Attorney, Agent, or Firm*—Oblon, Spivak, McClelland, Maier & Neustadt, P.C.

[57] ABSTRACT

A two-fluid cleaning jet nozzle has an atomizing unit provided with an atomizing tube in which a liquid is atomized by a pressurized gas into liquid droplets, and an accelerating unit provided with an accelerating tube which accelerates and jets the liquid droplets against the surface of a workpiece to remove dust particles adhering to the surface of the workpiece. The sectional area of the atomizing tube available for gas flow is greater than the sectional area of the accelerating tube available for flow of the gas and the liquid droplets. The accelerating tube has the shape of a straight cylindrical tube or a Laval nozzle.

23 Claims, 10 Drawing Sheets

TWO-FLUID CLEANING JET NOZZLE AND CLEANING APPARATUS, AND METHOD UTILIZING THE SAME

BACKGROUND OF THE INVENTION

1. Field of the Invention

The present invention relates to a two-fluid cleaning jet nozzle and, more specifically, to a two-fluid cleaning jet nozzle for clearing a workpiece such as a semiconductor wafer, or the like, of contaminants adhering to the workpiece. The present invention further relates to a cleaning apparatus and method provided with such a two-fluid cleaning jet nozzle to clean a workpiece, such as a semiconductor wafer of contaminants adhering to the workpiece.

2. Background of the Invention

Generally, various contaminants adhere to the surface of a semiconductor wafer during semiconductor device fabricating processes. For example, dust particles adhere to the surface of an insulating film or a metal film formed on a semiconductor wafer by a CVD process or a sputtering process. When a semiconductor wafer carrying a film or films is subjected to dry etching to pattern the film, resist particles or metal particles remain on the surface of the semiconductor wafer. There have been proposed high-pressure cleaning methods, ice scrubber cleaning methods and liquid jet cleaning methods using a two-fluid cleaning jet nozzle to remove such contaminants from the semiconductor wafer.

FIG. 17 is a view of a conventional high-pressure jet cleaning apparatus. When cleaning a semiconductor wafer 5 by this high-pressure jet cleaning apparatus, the semiconductor wafer 5 is supported on a stage 6 which is rotated by a motor 7. A high-pressure jet nozzle 69 connected to a pressurized liquid supply unit 68 by a pipe is disposed opposite to the semiconductor wafer 5 supported on the stage 6.

When cleaning the surface of the semiconductor wafer 5, a liquid such as pure water is pressurized to 50 to 100 kgf/cm$^2$ by the pressurized liquid supply unit 68 and is supplied through the pipe to the high-pressure jet nozzle 69. The high-pressure jet nozzle 69 jets the high-pressure liquid continuously through a nozzle hole of about 0.1 mm in diameter against the surface of the semiconductor wafer 5 to remove contaminants adhering to the surface of the semiconductor wafer 5.

The cleaning ability of this high-pressure jet cleaning apparatus, however, is not satisfactory and in some cases the high-pressure jet cleaning apparatus is unable to remove dust particles of 1 μm diameter or smaller. The cleaning ability can be enhanced by raising the pressure of the high-pressure liquid to jet the liquid at an increased jetting velocity. However, the liquid pressurizing unit 68 must be of a large capacity to pressurize the liquid at a higher pressure, which is not economically advantageous. Concretely, the jetting velocity of the liquid is about 130 m/s when the pressure of the liquid is 100 kgf/cm$^2$.

FIG. 18 is a sectional view of a conventional two-fluid cleaning jet nozzle 70. The two-fluid cleaning jet nozzle 70 has a first tube 72 for conducting a gas and a second tube 73 for conducting a liquid. The front end portion of the second tube 73 is disposed in the first tube with its axis in parallel to that of the first tube 72.

FIG. 19 is a view of a two-fluid cleaning apparatus for cleaning semiconductor wafers, employing the conventional two-fluid cleaning jet nozzle 70, and having a process cup 8, a stage 6 disposed in the process cup 8 to hold a semiconductor wafer 5, a motor 7 for rotating the stage 6, the two-fluid cleaning jet nozzle 70 for jetting liquid toward the surface of the semiconductor wafer 5, a gas supply means 2a for supplying a pressurized gas to the two-fluid cleaning jet nozzle 70 and a liquid supply means 3a for supplying a pressurized liquid to the two-fluid cleaning jet nozzle 70. A discharge duct 9 is connected to the process cup 8. The two-fluid cleaning jet nozzle 70 is held and moved by a robot arm 4.

In operation, the semiconductor wafer 5 is held fixedly on the stage 6 which is rotated at a predetermined rotating speed. The gas supply means 2a and the liquid supply means 3a supply a pressurized gas and a pressurized liquid, respectively, to the two-fluid cleaning jet nozzle 70. The two-fluid cleaning jet nozzle 70 mixes the gas and the liquid so that the liquid is changed into liquid droplets 1 as shown in FIG. 18. The liquid droplets 1 are accelerated in a section a–b of the first tube 72 by the flow of the gas and are jetted through the front end of the first tube 72 against the surface of the semiconductor wafer 5, as shown in FIG. 19, to remove contaminants adhering thereto. The contaminants removed from the semiconductor wafer 5, the liquid droplets 1 scattered by the surface of the semiconductor wafer 5 and the gas jetted by the two-fluid cleaning jet nozzle 70 are discharged from the process cup 8 through the discharge duct 9. During the cleaning operation, the robot arm 4 holding the two-fluid cleaning jet nozzle 70 moves the two-fluid cleaning jet nozzle 70 horizontally along the surface of the semiconductor wafer 5 to clean the entire surface of the semiconductor wafer 5.

The cleaning ability of the two-fluid cleaning apparatus employing the two-fluid cleaning jet nozzle 70 is higher than that of the foregoing high-pressure jet cleaning apparatus, and its running cost is lower than that of a conventional ice scrubber cleaning apparatus. The two-fluid cleaning apparatus does not break minute or micro patterns on the wafer and does not damage metal films having a relatively low hardness because the cleaning force can be controlled to vary in a wide range. However, the cleaning effect of the two-fluid cleaning apparatus is lower than that of the ice scrubber cleaning apparatus, reasons for which will be described hereinafter.

When cleaning a semiconductor wafer by the two-fluid cleaning jet nozzle 70, the cleaning ability of the two-fluid cleaning jet nozzle 70 is dependent on the velocity of the liquid droplets, and the velocity of the liquid droplets is dependent on the flow rate of the gas, the flow rate of the liquid, the length of the section a–b of the first tube 72 and the sectional area of the bore of the first tube 72. For example, the velocity of the liquid droplets is 224 n/s when the flow rate of the gas is 200 l/min, the flow rate of the liquid is 100 ml/min, the length of the section a–b is 100 mm, and the inside diameter of the first tube 72 is 4.35 mm. Since the dimensions of the two-fluid cleaning jet nozzle 70 is fixed, the velocity of the liquid droplets is dependent on the respective flow rates of the gas and the liquid, particularly on the high flow rate of the gas.

As shown in FIG. 18, the first tube 72 is straight, and the sectional area of a portion of the bore of the first tube 72 corresponding to the front end portion of the second tube 73 is smaller than that of the section a–b of the bore of the first tube 72. Therefore, the flow rate of the gas is limited by the sectional area of the narrowest portion of the bore of the first tube 72 around the front end portion of the second tube 73. Usually, the gas is supplied at a maximum pressure of 10 kgf/cm$^2$. In the semiconductor device manufacturing industry, the maximum pressure of such a gas is about 7 kgf/cm². If the outside diameter of the second tube 73 is 3.2 mm, for example, the sectional area of an annular space around the front end portion of the second tube 73 is 6.8 mm² and, if the supply pressure of the gas is 7 kgf/cm², the flow rate of the gas is about 200 l/min and the velocity of the liquid droplets is 224 m/s.

Theoretically, the velocity of the gas in the two-fluid cleaning jet nozzle 70 can be increased up to about 330 m/s, substantially equal to the sound velocity, by supplying the gas at a high flow rate, if the front end portion of the two-fluid cleaning jet nozzle 70 is straight, similarly to the section a–b shown in FIG. 18. However, the velocity of the liquid droplets cannot be increased to the sound velocity in the two-fluid cleaning jet nozzle 70 if the maximum supply pressure of the gas is 7 kgf/cm². Since cleaning ability is dependent on the velocity of the liquid droplets, the cleaning ability of the two-fluid cleaning jet nozzle 70 is low when the supply pressure of the gas is in the ordinary range of supply pressure.

If the supply pressure of the gas is raised beyond the upper limit of the ordinary range of supply pressure, the flow rate of the gas increases and the velocity of the liquid droplets increases. However, as mentioned above, the maximum velocity of the liquid droplets is limited to the sound velocity. If ice particles used for ice scrubber cleaning and liquid droplets such as water droplets used for two-fluid cleaning are caused to impinge on a surface to be cleaned, the cleaning ability of ice scrubber cleaning is higher than that of two-fluid cleaning because of the difference in physical properties between ice and a liquid such as water. Since the velocity of ice particles for ice scrubber cleaning can be increased to the sound velocity at the maximum, the cleaning ability of the two-fluid cleaning using the two-fluid cleaning jet nozzle 70 is unable to exceed that of ice scrubber cleaning.

The conventional cleaning apparatus shown in FIG. 19 has the following problems. The process cup 8 must have a large exhaust capacity, which is economically disadvantageous. Also, the two-fluid cleaning jet nozzle 70 is held at an angle of 60° or less to the surface of the semiconductor wafer 5 to secure a satisfactory discharge of the used liquid and the used gas, with the results that the cleaning ability of the two-fluid cleaning jet nozzle 70 is insufficient and it is difficult to control the cleaning ability of the two-fluid cleaning jet nozzle 70 to prevent damaging micro patterns. Contaminants removed from the surface of the semiconductor wafer 5 must be discharged together with the liquid droplets and the gas from the process cup 8 through the discharge duct 9 to prevent the contaminants from adhering again to the surface of the semiconductor wafer 5. Therefore, the discharge duct 9 is disposed opposite to the two-fluid cleaning jet nozzle 70 so that the liquid droplets and the gas are discharged satisfactorily. In the cleaning apparatus shown in FIG. 19, the liquid droplets and the gas must be discharged at a discharge rate of about 5 m³/min or more.

If the two-fluid cleaning jet nozzle 70 is inclined at an angle of 60° or more to the surface of the semiconductor wafer 5, jets of the liquid droplets and the gas are repelled back by the surface of the semiconductor wafer 5 and the liquid and the gas are scattered upward through the upper opening of the process cup 8 to cause the contaminants removed from the surface of the semiconductor wafer 5 to adhere again to the surface of the semiconductor wafer 5. The force exerted by the liquid droplets on the micro patterns (external force), hence the degree of damage to the micro patterns, is dependent on the angle of impingement of the liquid droplets. The nearer the angle of impingement of the liquid droplets to 90°, the higher is the cleaning ability, and the less is the damage to micro patterns. Therefore, it is difficult to control damage to micro patterns due to the difference in the angle of impingement of the liquid droplets on the surface of the semiconductor wafer 5 if the liquid droplets are jetted obliquely against the surface of the semiconductor wafer 5. Such problems arise also when removing contaminants adhering to substrates including liquid crystal display plates and photomasks.

As mentioned above, the ability of the conventional cleaning apparatus to clean semiconductor materials is low and they are unable to remove micro dust particles. Also, the cleaning ability of the cleaning apparatus cannot satisfactorily be controlled to reduce damage to semiconductor materials.

SUMMARY OF THE INVENTION

Accordingly, it is a first object of the present invention to provide a two-fluid cleaning jet nozzle capable of effectively removing contaminants adhering to the surface of a semiconductor wafer or the like, and to provide a cleaning apparatus employing the two-fluid cleaning jet nozzle.

A second object of the present invention is to provide an improved two-fluid cleaning jet nozzle capable of removing micro dust particles of 1 $\mu$m or less in particle size adhering to a semiconductor wafer or the like, and to provide a cleaning apparatus employing the two-fluid cleaning jet nozzle.

A third object of the present invention is to provide an improved two-fluid cleaning jet nozzle capable of jetting liquid droplets at a jetting velocity exceeding sound velocity, and to provide a cleaning apparatus employing the two-fluid cleaning jet nozzle.

A fourth object of the present invention is to provide a cleaning apparatus capable of operating at a low running cost.

A fifth object of the present invention is to provide an improved two-fluid cleaning jet nozzle capable of satisfactorily removing contaminants adhering to the surface of a semiconductor wafer or the like without damaging the surface of the same, and to provide a cleaning apparatus employing the two-fluid cleaning jet nozzle.

According to one aspect of the present invention, a two-fluid cleaning jet nozzle comprises an atomizing unit for atomizing a pressurized liquid into liquid droplets by a pressurized gas, and an accelerating unit for jetting the liquid droplets into the atmosphere. The sectional area of the narrowest portion of a passage for the gas in the atomizing unit is greater than the sectional area of the narrowest portion of a passage in the accelerating unit.

In another aspect of the present invention, in the two-fluid cleaning jet, the accelerating unit has a straight tube having a bore of a circular cross section.

In another aspect of the present invention, in the two-fluid cleaning jet, the accelerating unit has a straight tube of a length in the range of 30 to 200 mm; having a bore of 3 mm² or more in sectional area.

In another aspect of the present invention, in the two-fluid cleaning jet nozzle, the bore of the straight tube of the accelerating unit diverges gradually from an end joined to the atomizing unit in the liquid droplet jetting direction, like the bore of a Laval nozzle.

In another aspect of the present invention, in the two-fluid cleaning jet nozzle, the straight tube of the accelerating unit has a length in the range of 30 to 200 mm, and has a nozzle throat of a sectional area of 3 mm² or more.

In another aspect of the present invention, in the two-fluid cleaning jet nozzle, the atomizing unit has a cylindrical shape.

In another aspect of the present invention, in the two-fluid cleaning jet nozzle, the atomizing unit has a shape converging toward its end joined to the accelerating unit.

In another aspect of the present invention, in the two-fluid cleaning jet nozzle, the atomizing unit has a first tube for conducting the gas and a second tube for jetting the liquid into the first tube in the flow direction of the gas.

In another aspect of the present invention, in the two-fluid cleaning jet nozzle, the flowing direction of the gas in the first tube and the flowing direction of the liquid in the second tube are the same as a direction in which the liquid droplets are jetted.

In another aspect of the present invention, in the two-fluid cleaning jet nozzle, the atomizing unit has a first tube for conducting the gas, a second tube disposed in the first tube to jet the liquid, and a third tube disposed in the second tube to jet the gas.

In another aspect of the present invention, in the two-fluid cleaning jet nozzle, the flowing direction of the gas in the first and third tube and the flowing direction of the liquid in the second tube are the same as a direction in which the liquid droplets are jetted.

In another aspect of the present invention, in the two-fluid cleaning jet nozzle, the sectional area of a gas inlet through which the gas is supplied into the atomizing unit is greater than the sectional area of the bore of the accelerating tube.

In another aspect of the present invention, in the two-fluid cleaning jet nozzle, the accelerating unit is provided at its front end portion with a baffle extending substantially perpendicularly to the liquid droplet jetting direction.

According to another aspect of the present invention, a cleaning apparatus comprises the two-fluid cleaning jet nozzle as set forth above, a gas supply means connected to the atomizing unit of the two-fluid cleaning jet nozzle to supply compressed gas into the atomizing unit, and a liquid supply means connected to the atomizing unit of the two-fluid cleaning jet nozzle to supply a pressurized liquid into the atomizing unit.

In another aspect of the present invention, in the cleaning apparatus, the two-fluid cleaning jet nozzle is disposed with the front end of the accelerating unit spaced a distance in the range of 5 to 50 mm from the surface of a workpiece to be cleaned.

In another aspect of the present invention, the gas and the liquid are supplied to the two-fluid cleaning jet nozzle at a pressure in the range of 1 to 10 kgf/cm².

According to another aspect of the present invention, in a cleaning method of a workpiece, a compressed gas is supplied into an atomizing unit of the two-fluid cleaning jet nozzle from a gas supply means connected to the atomizing unit. A pressurized liquid is supplied into the atomizing unit of the two-fluid cleaning jet nozzle from a liquid supply means connected to the atomizing unit. Further, the gas mixed with the liquid droplets is jetted from the two-fluid cleaning jet nozzle to impinge on the workpiece.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
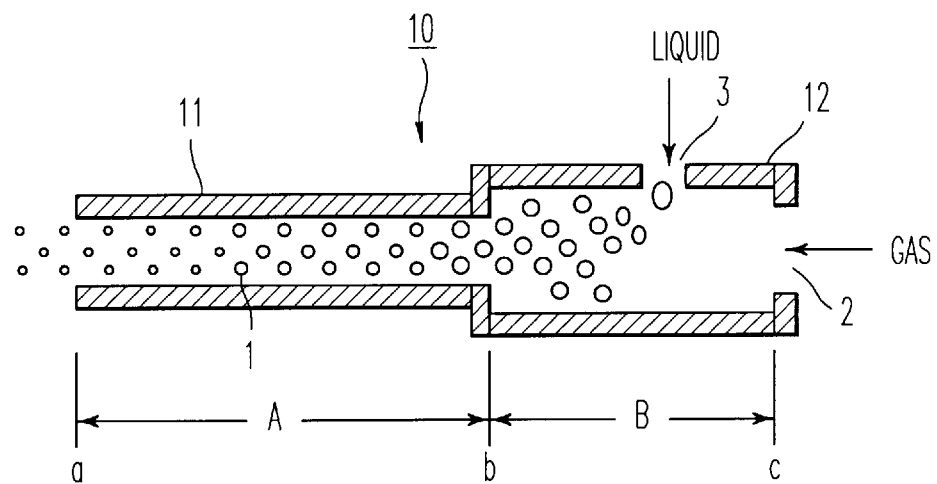
FIG. 1 is a sectional view of a two-fluid cleaning jet nozzle in a preferred embodiment according to the present invention.

Preferred embodiments of the present invention will be described hereinafter with reference to the accompanying drawings, in which like parts are designated by the same reference characters.

First Embodiment

FIG. 1 is a sectional view of a two-fluid cleaning jet nozzle 10 in a first embodiment of the invention. The two-fluid cleaning jet nozzle 10 mixes pressurized gas and a pressurized liquid to produce liquid droplets, and jets the liquid droplets against the surface of a workpiece to be cleaned. The two-fluid cleaning jet nozzle 10 has an accelerating unit A provided with an accelerating tube 11 for accelerating liquid droplets, and an atomizing unit B provided with an atomizing tube 12 for atomizing the pressurized liquid into liquid droplets by the pressurized gas. The atomizing tube 12 has a gas inlet 2 and a liquid inlet 3.

The accelerating tube 11, which corresponds to a section a–b, has the shape of a straight cylindrical tube of a length in the range of 30 to 200 mm, and has a bore of a sectional area in the range of 3 to 15 $mm^2$. The atomizing tube 12, which corresponds to a section b–c, has the shape of a straight cylindrical tube of a length in the range of 3 to 50 mm, and has a bore of a sectional area in the range of 7 to 100 $mm^2$. The gas inlet 2 of the atomizing tube 12 has a sectional area in the range of 7 to 200 $mm^2$, and the liquid inlet 3 of the same has a sectional area in the range of 0.01 to 20 $mm^2$.

In the two-fluid cleaning jet nozzle 10 in the first embodiment, the section a–b of the accelerating tube 11 is 100 mm in length and has a bore of 7 $mm^2$ in sectional area, and the section b–c of the atomizing tube 12 is 30 mm in length and has a bore of 20 $mm^2$ in sectional area. The sectional areas of the gas inlet 2 and the liquid inlet 3 are 15 $mm^2$ and 5 $mm^2$, respectively.

Figure 2:
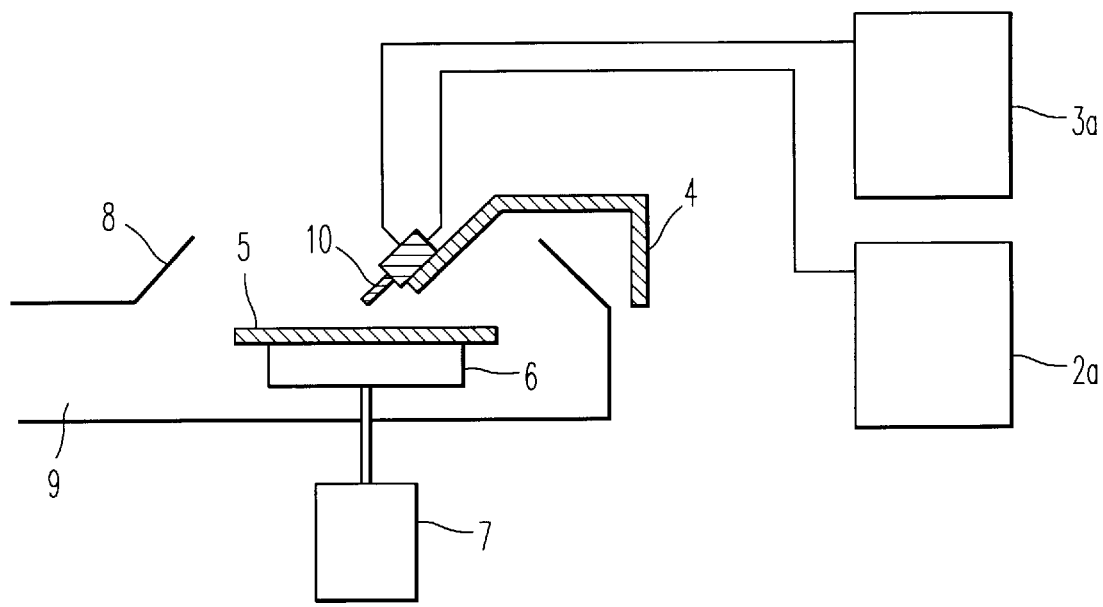
FIG. 2 is a schematic view of a cleaning apparatus provided with the two-fluid cleaning jet nozzle for cleaning, for example, a semiconductor wafer.

FIG. 2 is a view of a cleaning apparatus provided with the two-fluid cleaning jet nozzle 10 for cleaning, for example, a semiconductor wafer. The cleaning apparatus removes contaminants adhering to the surface of a semiconductor wafer 5. The cleaning apparatus has a gas supply unit 2a and a liquid supply unit 3a connected to the two-fluid cleaning jet nozzle 10 to supply a gas and a liquid, respectively, to the two-fluid cleaning jet nozzle 10. The cleaning apparatus has also a stage 6 for fixedly supporting the semiconductor wafer 5, a motor 7 for driving the stage 6 for rotation, a process cup 8 for preventing liquid droplets from scattering, a discharge duct 9 joined to the process cup 8, and a robot having a robot arm 4 for holding and moving the two-fluid cleaning jet nozzle 10.

The cleaning operation of the cleaning apparatus will be described hereinafter. The semiconductor wafer 5 is fixedly mounted on the stage 6 and the motor 7 is actuated to rotate the stage 6 at a predetermined rotating speed. A pressurized gas supplied from the gas supply unit 2a and a pressurized liquid supplied from the liquid supply unit 3a flow through the gas inlet 2 and the liquid inlet 3, respectively, into the atomizing tube 12 of the two-fluid cleaning jet nozzle 10. The gas and the liquid are mixed in an atomizing unit B, i.e., the section b–c of the atomizing tube 12, of the two-fluid cleaning jet nozzle 10, and the liquid is atomized or changed into liquid droplets 1. The liquid droplets 1 are accelerated by the gas in an accelerating unit A, i.e., the section a–b of the accelerating tube 11, of the two-fluid cleaning jet nozzle 10. The liquid droplets 1 are further atomized into smaller liquid droplets as the same are accelerated in the accelerating unit A, i.e., in the section a–b of the accelerating tube 11, and the very small liquid droplets 1 are jetted through the front end of the two-fluid cleaning jet nozzle 10.

The liquid droplets 1 jetted by the two-fluid cleaning jet nozzle 10 impinge on the surface of the semiconductor wafer 5 as shown in FIG. 2 to remove contaminants adhering to the surface of the semiconductor wafer 5. Contaminants thus removed from the surface of the semiconductor wafer 5, the liquid droplets 1 impinged on and scattered by the surface of the semiconductor wafer 5, and the gas jetted by the two-fluid cleaning jet nozzle 10 are discharged from the process cup 8 through the discharge duct 9. The robot arm 4 holding the two-fluid cleaning jet nozzle 10 moves the two-fluid cleaning jet nozzle 10 horizontally along the surface of the semiconductor wafer 5 to clean the entire surface of the semiconductor wafer 5.

Figure 3:
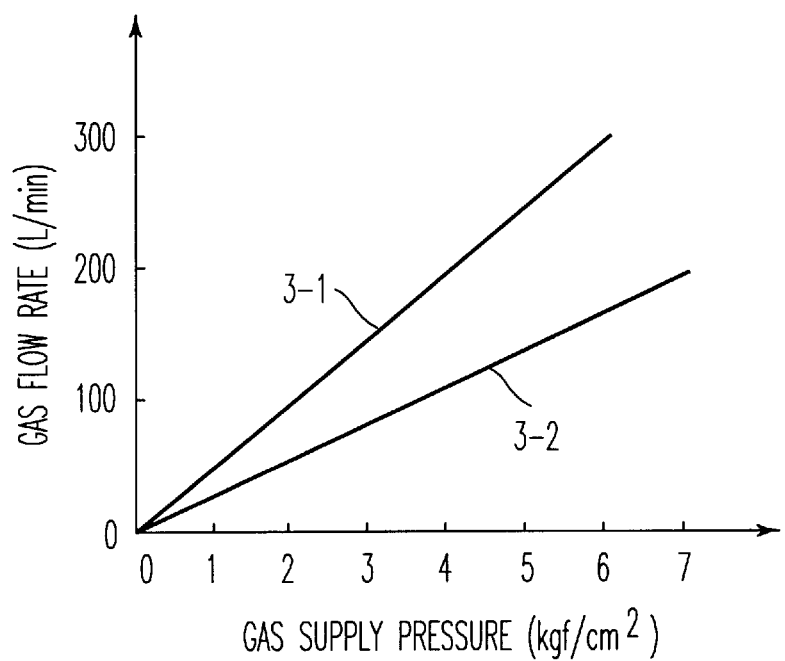
FIG. 3 shows the relation between the flow rate of the gas and the supply pressure of the gas for the two-fluid cleaning jet nozzle of the present invention shown in FIG. 1 and the conventional two-fluid cleaning jet nozzle shown in FIG. 18.
Figure 18:
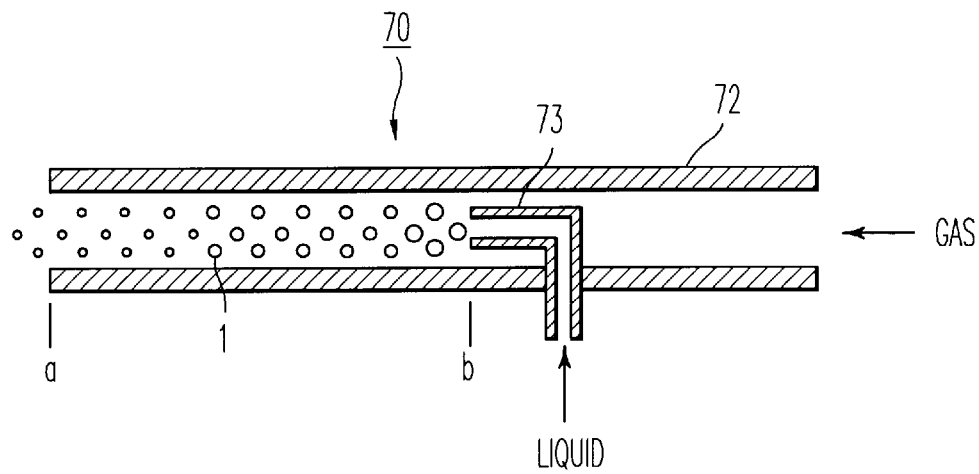
FIG. 18 is a sectional view of a conventional two-fluid cleaning jet nozzle.
Figure 19:
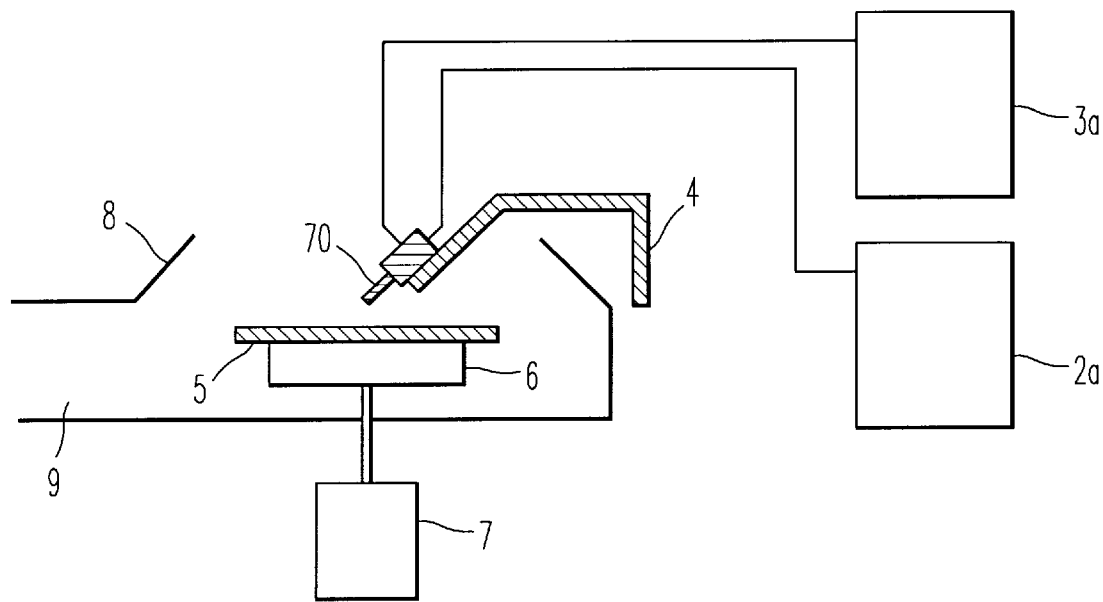
FIG. 19 is a schematic view of a two-fluid cleaning apparatus for cleaning semiconductor wafers, employing the conventional two-fluid cleaning jet nozzle.

FIG. 3 shows the relation between the flow rate of the gas and the supply pressure of the gas for the two-fluid cleaning jet nozzle 10 of the present invention shown in FIG. 1 (curve 3-1) and the conventional two-fluid cleaning jet nozzle 70 shown in FIG. 18 (curve 3-2). In the two-fluid cleaning jet nozzle 10 of the present invention, the accelerating unit A is 3 mm in inside diameter (a bore of 7 $mm^2$ in sectional area), and the bore of the atomizing unit B is 20 $mm^2$ in sectional area. In the conventional two-fluid cleaning jet nozzle 70, the first tube 72 is 4.35 mm in inside diameter (a bore of 15 $mm^2$ in sectional area), the second tube 73 is 6.8 mm in outside diameter, and the sectional area of the annular space between the inner circumference of the first tube 72 and the outer circumference of the front end portion of the second tube 73 is 6.8 $mm^2$.

As is clear from FIG. 3, the flow rate of the gas flowing through the two-fluid cleaning jet nozzle 10 of the present invention is higher than that of the gas flowing through the conventional two-fluid cleaning jet nozzle 70 for the same supply pressure of the gas. It is inferred that, in the conventional two-fluid cleaning jet nozzle 70, the sectional area of the annular space between the inner circumference of the straight first tube 72 and the outer circumference of the front end portion of the second tube 73 is smaller than the sectional area of the portion of the bore of the first tube 72 in the section a–b, so that the flow rate of the gas flowing through the first tube 72 is limited by the sectional area of the annular space.

Figure 4:
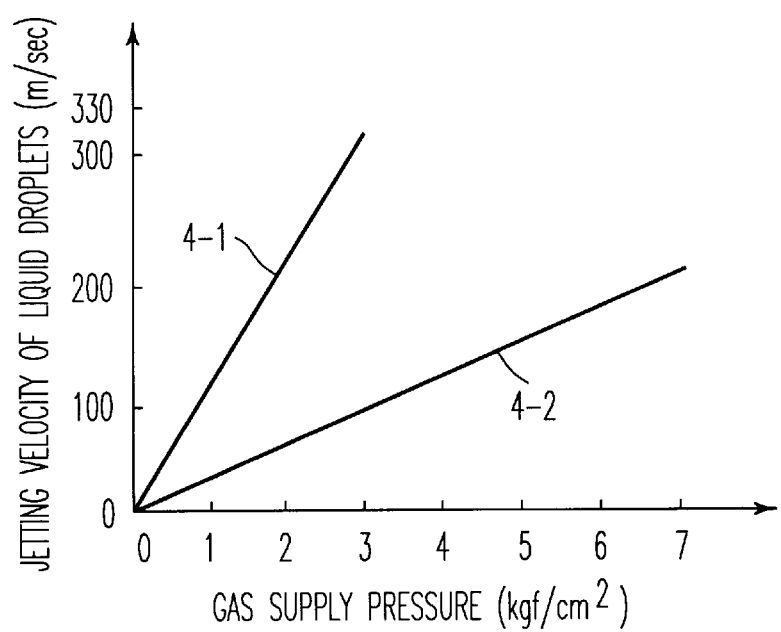
FIG. 4 is a graph showing the relation between the jetting velocity of liquid droplets and the supply pressure of the gas for the two-fluid cleaning jet nozzle of the present invention and for the conventional two-fluid cleaning jet nozzle.

FIG. 4 is a graph showing the relation between the jetting velocity of liquid droplets and the supply pressure of the gas for the two-fluid cleaning jet nozzle 10 of the present invention (curve 4-1) and for the conventional two-fluid cleaning jet nozzle 70 (curve 4-2). As is clear from FIG. 4, the jetting velocity of liquid droplets jetted by the two-fluid cleaning jet nozzle 10 of the present invention is higher than that of liquid droplets jetted by the conventional two-fluid cleaning jet nozzle 70 for the same supply pressure of the gas.

Suppose that the front end portion of the conventional two-fluid cleaning jet nozzle 70 is 4.35 mm in inside diameter (15 $mm^2$ in sectional area of the bore of the corresponding portion), and the front end portion of the accelerating tube 11 of the two-fluid cleaning jet nozzle 10 of the present invention is 3 mm in inside diameter (7 $mm^2$ in sectional area for the bore of the corresponding portion). Then the jetting velocity of the liquid droplets jetted by the two-fluid cleaning jet nozzle 10 of the present invention reaches the sound velocity when the supply pressure of the gas is about 3 $kgf/cm^2$, whereas the jetting velocity of the liquid droplets jetted by the conventional two-fluid cleaning jet nozzle 70 is 224 m/s when the supply pressure of the gas is 7 $kgf/cm^2$. The supply pressure of the gas must be 10 $kgf/cm^2$ or above to jet the liquid droplets at the sound velocity by the conventional two-fluid cleaning jet nozzle 70. Thus, the two-fluid cleaning jet nozzle 10 of the present invention is capable of jetting the liquid droplets at a relatively high jetting velocity by gas of a relatively low supply pressure.

Figure 5:
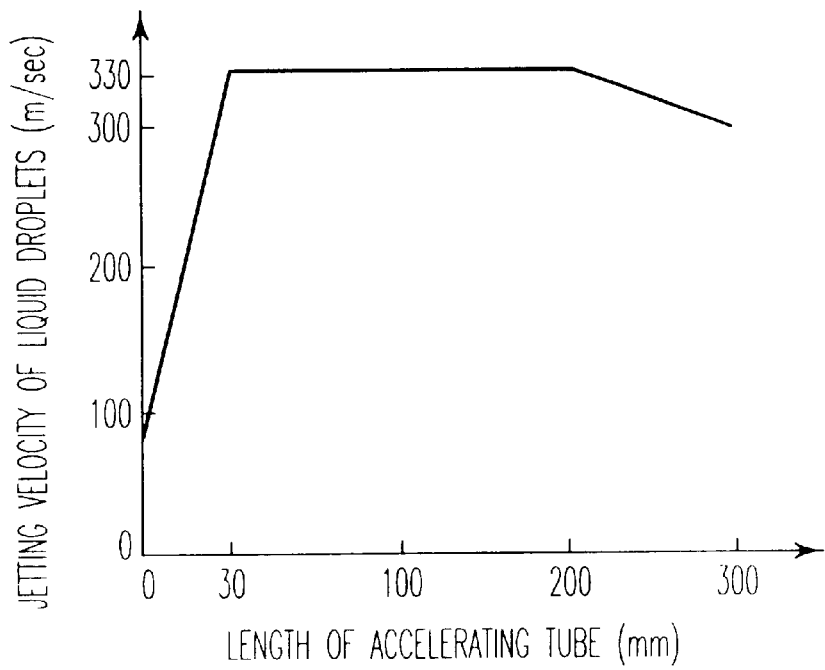
FIG. 5 is a graph showing the relation between the jetting velocity of the liquid droplets and the length of the accelerating tube of the two-fluid cleaning jet.

FIG. 5 is a graph showing the relation between the jetting velocity of the liquid droplets and the length of the section A of the two-fluid cleaning jet nozzle 10, i.e., the length of the section a–b of the accelerating tube 11. As is clear from FIG. 5, the jetting velocity is relatively low if the length of the section A is 30 mm or below because the length of the section A is not long enough to accelerate the liquid droplets 1 produced in the atomizing unit B to a sufficiently high velocity by the gas. The jetting velocity of the liquid droplets 1 decreases gradually with the increase of the length of the accelerating unit A of the two-fluid cleaning jet nozzle 10 when the length of the accelerating unit A increases beyond 200 mm, because the flow resistance of the accelerating unit A is high when it is excessively long. Therefore, an appropriate length of the accelerating unit A of the two-fluid cleaning jet nozzle 10 is in the range of 30 to 200 mm.

Figure 6:
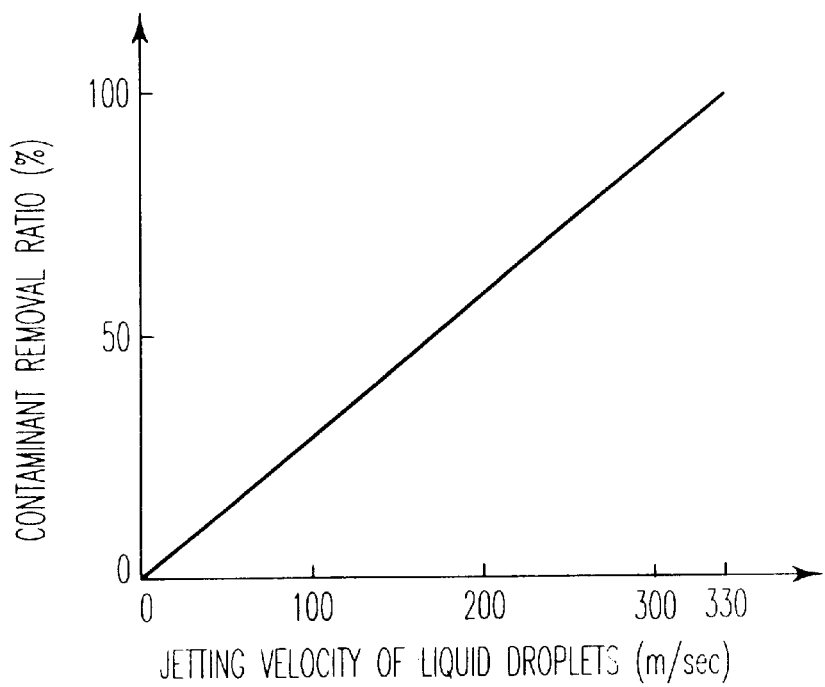
FIG. 6 is a graph showing the relation between the cleaning ability of the two-fluid cleaning jet nozzle expressed by contaminant removal ratio ,and the jetting velocity of the liquid droplets.

FIG. 6 is a graph showing the relation between the cleaning ability of the two-fluid cleaning jet nozzle 10 expressed by contaminant removal ratio and the jetting velocity of the liquid droplets. As is clear from FIG. 6, the cleaning ability of the two-fluid cleaning jet nozzle 10 rises in proportion to the jetting velocity of the liquid droplets.

Figure 7:
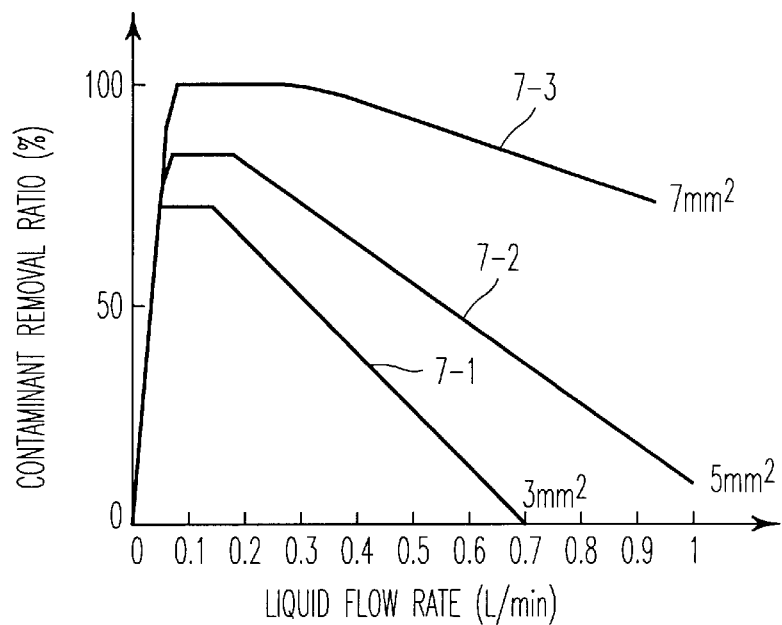
FIG. 7 shows the dependence of the cleaning ability of the two-fluid cleaning jet nozzle on the flow rate of the liquid for different sectional areas of the bore of the accelerating tube 11 for a fixed supply pressure of the gas.

FIG. 7 shows the dependence of the cleaning ability of the two-fluid cleaning jet nozzle 10 on the flow rate of the liquid for sectional areas of 3 mm$^2$ (curve 7-1), 5 mm$^2$ (curve 7-2) and 7 mm$^2$ (curve 7-3) of the bore of the accelerating tube 11 for a fixed supply pressure of the gas. Since the supply pressure of the gas is fixed, the flow rate of the gas is high when the sectional area of the bore of the accelerating tube 11 is large.

As is clear from FIG. 7, the cleaning ability is low when the flow rate of the liquid is relatively low, which is because the number of liquid droplets is small and hence cleaning efficiency is low when the flow rate of the liquid is low. Under the foregoing conditions, the flow rate of the liquid must be 100 ml/min or more to achieve a sufficiently high contaminant removal ratio. The cleaning ability decreases gradually with the increase of the flow rate of the liquid beyond a certain limit, which is because gas flowing at a flow rate is capable of accelerating a limited number of liquid droplets, and hence liquid droplets cannot be accelerated to a sufficiently high jetting velocity if the liquid is supplied at an excessively high flow rate.

If the sectional area of the bore of the accelerating tube 11 of the accelerating unit A is relatively small, the flow rate of the gas is relatively low and hence liquid droplets can be accelerated satisfactorily only when the liquid is supplied at a relatively low flow rate, and the contaminant removal ratio is small. If the sectional area of the bore of the accelerating tube 11 of the accelerating unit A is relatively large, the flow rate of the gas is relatively high and hence liquid droplets can be accelerated satisfactorily even if the liquid is supplied at a relatively high flow rate, and the contaminant removal ratio is large. However, if the sectional area of the bore of the accelerating tube 11 is excessively large, the gas needs to be supplied at a very high flow rate and the running cost increases, which is economically disadvantageous. If the flow rate of the gas is high, the process cup 8 needs to be exhausted at a high discharge rate, which also increases the running cost and is economically disadvantageous.

With the foregoing conditions in view, a desirable sectional area of the bore of the accelerating tube 11 is 3 mm$^2$ or above, practically, in the range of about 3 to about 15 mm$^2$ Experiments showed that an optimum sectional area of the bore of the accelerating tube 11 is about 7 mm$^2$. Preferably, the accelerating tube 11 of the accelerating unit A is a straight, cylindrical tube which exerts a relatively low resistance to the flow of fluids.

The sectional area of the bore of the atomizing tube 12 of the atomizing unit B must be greater than that of the bore of the accelerating tube 11 of the accelerating unit A. If the sectional area of the bore of the atomizing tube 12 is smaller than that of the bore of the accelerating tube 11, the flow rate of the gas flowing into the atomizing unit B is reduced and the liquid droplets cannot be accelerated to a jetting velocity high enough to provide the two-fluid cleaning jet nozzle 10 with a satisfactorily high cleaning ability. If the sectional area of the atomizing tube 12 of the atomizing unit B is excessively large, the liquid cannot satisfactorily be atomized, which reduces cleaning efficiency. If the atomizing tube 12 of the atomizing unit B is excessively short, liquid droplets cannot be accelerated to a sufficiently high velocity, and the two-fluid cleaning jet nozzle 10 is unable to provide satisfactory cleaning ability. If the atomizing tube 12 of the atomizing unit B is excessively long, the resistance of the atomizing tube 12 to the flow of the fluids is high, which reduces the flow rate of the gas and hence the two-fluid cleaning jet nozzle 10 is unable to provide satisfactory cleaning ability.

Accordingly, the sectional area of the bore of the atomizing tube 12 of the atomizing unit B must be greater than 3 mm$^2$, which is the lower limit to the sectional area of the bore of the accelerating tube 11 of the accelerating unit A. Practically, a suitable sectional area of the bore of the atomizing tube 12 is in the range of 3 to 200 mm$^2$ and a suitable length of the atomizing tube 12 is in the range of 3 to 50 mm. Preferably, the atomizing tube 12 is a cylindrical tube which exerts a relatively low resistance to the flow of fluids.

The sectional area of the gas inlet 2 of the atomizing tube 12 must be greater than the sectional area of the bore of the accelerating tube 11 to avoid the flow rate of the gas being reduced, and must be equal to or less than the sectional area of the atomizing tube 12 for structural reasons. Accordingly, the sectional area of the gas inlet 2 must be not less than 3 mm$^2$, which is the lower limit of the suitable range of sectional area for the accelerating tube 11 of the accelerating unit A. A practically suitable sectional area of the gas inlet 2 is in the range of 7 to 200 mm$^2$.

Figure 8:
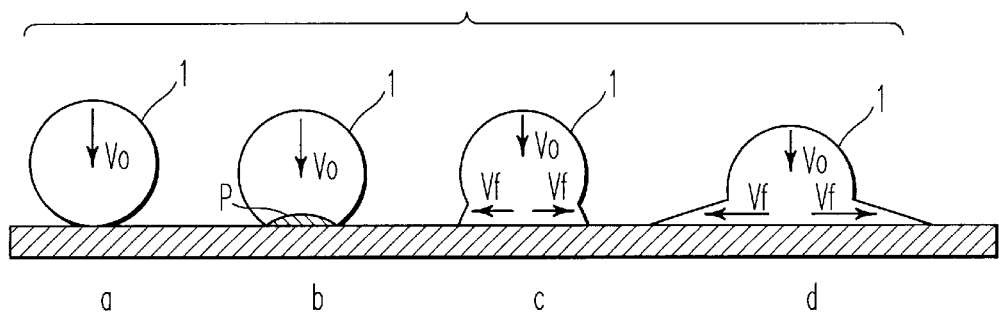
FIG. 8 is a diagrammatic view for explaining the cleaning action of a liquid droplets jetted against the surface of the semiconductor wafer.

The sectional area of the liquid inlet 3 must be large enough to enable the liquid to flow at a flow rate of about 100 ml/min or above necessary for securing a satisfactorily high contaminant removal ratio. Theoretically, a desired sectional area of the liquid inlet 3 is 0.04 mm$^2$ or above. It is desirable that the sectional area of the liquid inlet 3 is not excessively large to atomize the liquid satisfactorily in the atomizing tube 12 and to jet liquid droplets at a sufficiently high jetting velocity. Practically, a desirable sectional area of the liquid inlet 3 is in the range of 0.04 to 20 mm$^2$, The operation of the two-fluid cleaning jet nozzle 10 will be described with reference to FIG. 8. Upon the impingement of a liquid droplet 1 at a velocity $V_0$ on the surface of the semiconductor wafer 5 as shown in FIG. 8(a), the liquid droplet 1 exerts an impact pressure P on the surface of the semiconductor wafer 5 as shown in FIG. 8(b). The impact pressure P causes the liquid droplet 1 to flow in a horizontal radial flow at a velocity Vf as shown in FIG. 8(c). Consequently, the liquid droplet 1 deforms in a shape as shown in FIG. 8(d) to remove contaminants by the impact pressure P or the radial flow Vf.

The impact pressure P is expressed by the following expression.

$$P=(1/2)\cdot\alpha\rho_L C_L V_0 \quad (1)$$

where $V_0$ is the impact velocity, i.e., the velocity at impact on the surface of the semiconductor wafer 5, of the liquid droplet 1, $\rho_L$ is the density of the liquid, $C_L$ is the sound velocity in the liquid, and α is a reduction coefficient expressed by:

$$\alpha=(0.41)/(1+0.59(\rho_L C_L/\rho_S C_S)) \quad (2)$$

where $\rho_S$ is the density of the semiconductor wafer 5 and $C_S$ is the sound velocity in the semiconductor wafer 5.

The velocity Vf of the radial flow is expressed by:

$$Vf=(\alpha C_L V_0)^{1/2} \quad (3)$$

Suppose that the contaminant adhering to the surface of the semiconductor wafer 5 is a spherical particle. Then, an external force (particle removing force or cleaning force) D is expressed by:

$$D=C_D(\rho_L/2)Vf^2(\pi/4)d^2 \quad (4)$$

$$D=C_D P(\pi/4)d^2 \quad (5)$$

where CD is drag coefficient and d is the diameter of the spherical particle. Although different in form, expressions (4) and (5) are equivalent in effect.

It is known from Expressions (1) and (5) that the cleaning force D is proportional to the impact velocity $V_0$ of the liquid particles, and hence the cleaning force D can be increased by raising the impact velocity $V_0$.

The cleaning force D is not dependent on the particle size of the liquid droplets 1. The area covered by the liquid droplet 1 impinged on the surface of the semiconductor wafer 5 is dependent on the particle size of the liquid droplet 1. The area covered by the liquid droplets 1 affects the contaminant removal ratio. If the liquid is supplied at a fixed supply rate and the liquid is atomized in small liquid droplets 1, the number of the liquid droplets 1 increases in inverse proportion to the third power of the particle size of the liquid droplets, and the area covered by one liquid droplet at impact decreases in proportion to the second power of the particle size. Consequently, the overall impact area of liquid droplets increases to enhance cleaning effect.

This model applies also to the analysis of the behavior of ice particles in the conventional ice scrubber cleaning. Since the sound velocity $C_L$ in ice particles is higher than that in a liquid such as water, the cleaning force of ice particles is greater than that of liquid droplets, provided the respective impact velocities of ice particles and liquid droplets are equal to each other.

In the foregoing model, it is assumed that the liquid droplets 1 impinge on the surface of the semiconductor wafer 5 in a direction perpendicular to the surface of the semiconductor wafer 5. However, the liquid particles 1 impinge on the surface of the semiconductor wafer 5 at an angle in a practical cleaning operation. Therefore, Expression (4) and (5) are modified as follows.

$$D=C_D(\rho_L/2)Vf^2(\pi/4)d^2 \sin(\theta) \quad (6)$$

$$C=C_D P(\pi/4)d^2\sin(\theta) \quad (7)$$

where θ is the impact angle of the liquid droplets 1, i.e., the angle between the surface of the semiconductor wafer 5 and the direction of impact of the liquid droplets 1 on the surface of the semiconductor wafer 5.

Figure 9:
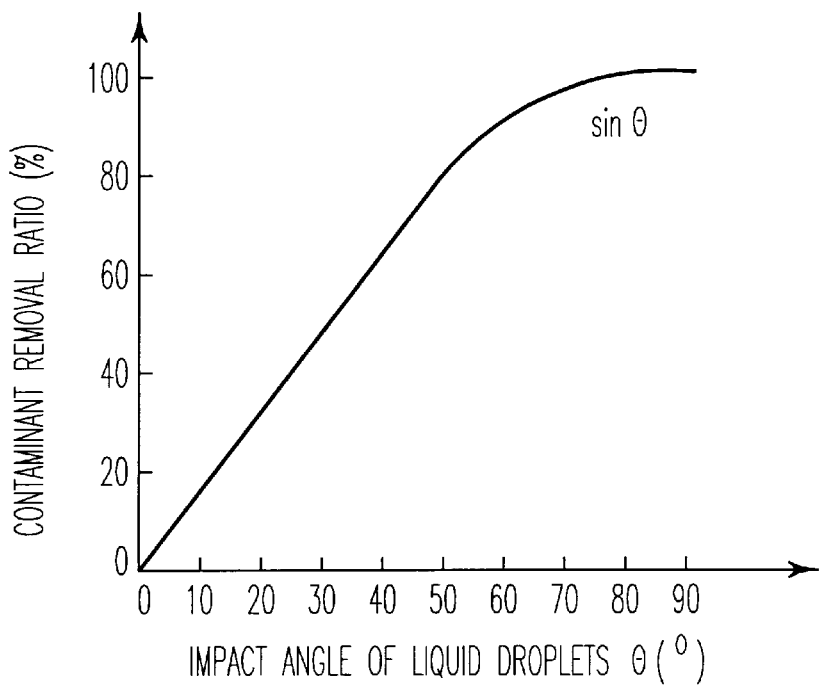
FIG. 9 is a graph showing the dependence of contaminant removal ratio representing cleaning ability on the impact angle of liquid droplets.

FIG. 9 is a graph showing the dependence of contaminant removal ratio representing cleaning ability on the impact angle θ of liquid droplets. As is obvious from FIG. 9, contaminant removal ratio increases as the impact angle increases from 0° toward 90° (where 0° is horizontal).

Figure 10:
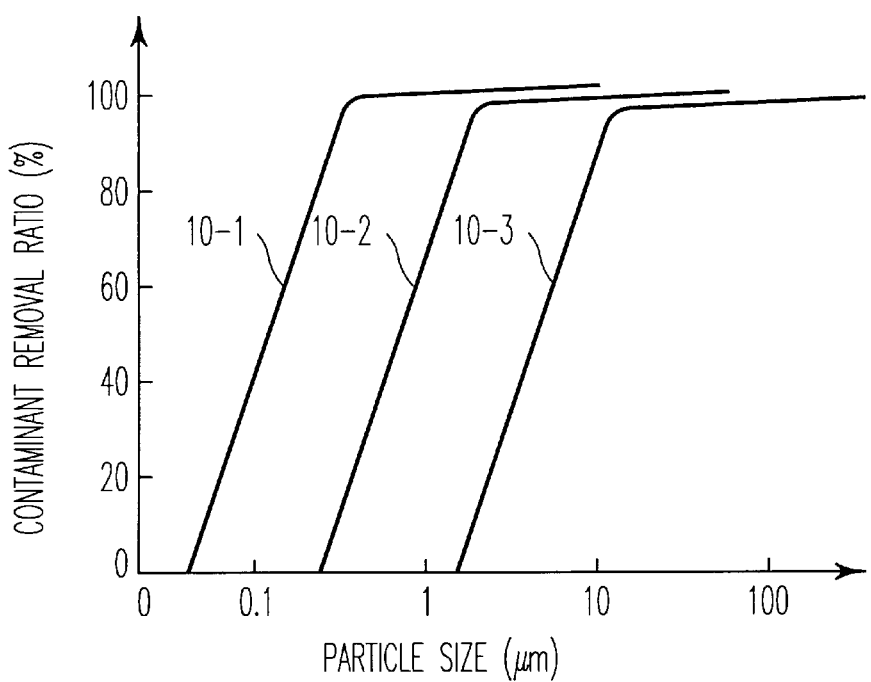
FIG. 10 is a graph showing the relation between particle size and contaminant removal ratio for different cleaning methods.

FIG. 10 is a graph showing the relation between particle size and contaminant removal ratio for different cleaning methods, i.e., a cleaning method employing the two-fluid cleaning jet nozzle 10 of the present invention (curve 10-1), a cleaning method employing the conventional two-fluid cleaning jet nozzle 70 (curve 10-2) and a high-pressure cleaning method employing a conventional high-pressure jet nozzle (curve 10-3). The effect of the conventional ice scrubber cleaning is substantially the same as that of the cleaning method employing the two-fluid cleaning jet nozzle 10 of the present invention, indicated by the curve 10-1 in FIG. 10. As is obvious from FIG. 10, the high-pressure cleaning method is unable to remove particles of 1 μm or below in particle size as indicated by the curve 10-3. Although the cleaning method employing the conventional two-fluid cleaning jet nozzle 70 exercises a cleaning ability indicated by the curve 10-2 higher than that exercised by the high-pressure cleaning method, the same is unable to remove particles of 0.1 gm in particle size. As indicated by the curve 10-1, the cleaning method employing the two-fluid cleaning jet nozzle 10 of the present invention is able to remove particles of particles sizes not greater than 0.1 μm.

Although the embodiment of the present invention has been described as applied to cleaning a semiconductor wafer, the present invention is applicable to removing contaminants adhering to the surfaces of liquid crystal panels, photomasks formed on a substrate and the like.

Second Embodiment

Figure 11:
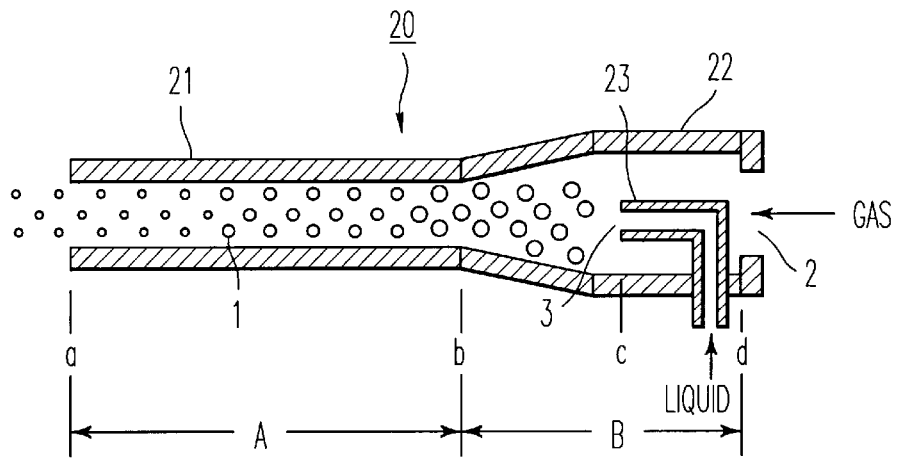
FIG. 11 shows a two-fluid cleaning jet nozzle in a second embodiment according to the present invention in a longitudinal sectional view.

FIG. 11 shows a two-fluid cleaning jet nozzle 20 in a second embodiment according to the present invention in a longitudinal sectional view. The two-fluid cleaning jet nozzle 20 has an accelerating unit A provided with an accelerating tube 21, and an atomizing unit B provided with an atomizing tube 22 in which a pressurized liquid is atomized into liquid droplets by pressurized gas. The atomizing tube 22 is provided with a gas inlet 2 through which the pressurized gas is supplied thereto, and a liquid supply tube 23 having a front end portion inserted into the atomizing tube 22 through the wall thereof, extended coaxially with the atomizing tube 22 and having a liquid outlet 3.

In the two-fluid cleaning jet nozzle 20, a section c–d of the atomizing unit B having a section b–d has a double-tube construction consisting of a portion of the atomizing tube 22 and the front end portion of the liquid supply tube 23. This two-tube construction is similar to that of the conventional two-fluid cleaning jet nozzle 70. However, the two-fluid cleaning jet nozzle 20 of the present invention differs from the conventional two-fluid cleaning jet nozzle 70 in that a portion of the atomizing tube 22 corresponding to the section c–d is expanded so that the sectional area of an annular space between the same portion of the atomizing tube 22 and the front end portion of the liquid supply tube 23 is greater than that of the bore of the accelerating tube 21 corresponding to a section a–b, and a portion of the atomizing tube 22 corresponding to a section b–c is tapered toward the accelerating tube 21. Therefore, the velocity of the pressurized gas is not reduced or limited in the annular space between said portion of the atomizing tube 22 and the front end portion of the liquid supply tube 23. Therefore, the gas is able to flow at a high flow rate to jet the liquid droplets at a sufficiently high jetting velocity even if the gas is supplied at a supply pressure lower than that at which the gas is supplied to the conventional two-fluid cleaning jet nozzle 70, and hence the cleaning ability of the two-fluid cleaning jet nozzle 20 is higher than that of the conventional two-fluid cleaning jet nozzle 70.

Since portion of the atomizing tube 22 corresponding to the section b–c is tapered toward the joint of the accelerating tube 21 and the atomizing tube 22, the velocity of the gas in the tapered portion of the atomizing tube 22 increases gradually toward the accelerating tube 21 without loss due to flow resistance of the passage. The liquid jetted through the liquid outlet into the atomizing tube 22 is atomized into liquid droplets 1 which are accelerated gradually by the flow of the gas, and the liquid droplets 1 are further atomized. Accordingly, the two-fluid cleaning jet nozzle 20 is capable of atomizing the liquid into smaller liquid droplets 1 and of jetting the liquid droplets 1 at a higher jetting velocity than the two-fluid cleaning jet nozzle 10 of the first embodiment shown in FIG. 1. Therefore, the cleaning ability of the two-fluid cleaning jet nozzle 20 in the second embodiment is higher than that of the two-fluid cleaning jet nozzle 10 in the first embodiment.

In the two-fluid cleaning jet nozzle 20 in the second embodiment, the accelerating tube 21 of the accelerating unit A (section a–b) is 100 mm in length and has a bore of 7 $mm^2$ in sectional area, the atomizing tube 22 of the atomizing unit B (section b–d) has a section b–c of 20 mm in length and a section c–d of 20 mm in length, the sectional area of the annular space between the inner circumference of the section c–d of the atomizing tube 22 and the outer circumference of the front end portion of the liquid supply tube 23 is 20 mm, the sectional area of the gas inlet 2 is 20 $mm^2$, the sectional area of the liquid outlet 3 is 3 mm, the atomizing tube 22 and the liquid supply tube 23 are cylindrical tubes, and the front end portion of the liquid supply tube 23 is disposed coaxially with atomizing tube 22 with its tip positioned at a position corresponding to position c.

The two-fluid cleaning jet nozzle 20 is capable of atomizing the liquid in micro liquid droplets, of jetting the liquid droplets at a high jetting velocity and of providing a high cleaning ability.

Third Embodiment

Figure 12:
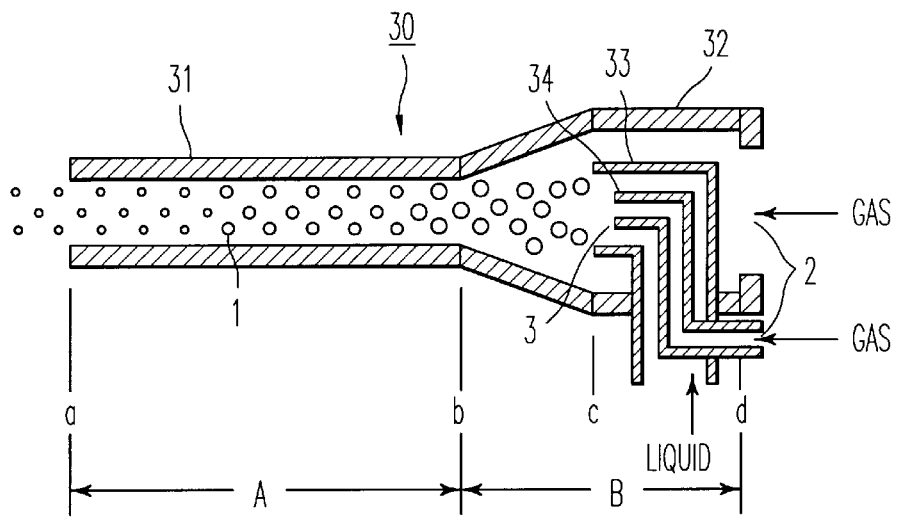
FIG. 12 shows a two-fluid cleaning jet nozzle in a third embodiment according to the present invention in a longitudinal sectional view.

FIG. 12 shows a two-fluid cleaning jet nozzle 30 in a third embodiment according to the present invention in a longitudinal sectional view.

The two-fluid cleaning jet nozzle 30 has an accelerating unit A (section a–b) provided with an accelerating tube 31, and an atomizing unit B (section b–d) provided with an atomizing tube 32 in which a pressurized liquid is atomized into liquid droplets by pressurized gas. The atomizing tube 32 is provided with a gas inlet 2 through which the pressurized gas is supplied into the atomizing tube 32, and a liquid supply tube 33 having a front end portion is inserted through the wall of the atomizing tube 32 into the atomizing tube 32, extended coaxially with the atomizing tube 32 and having a liquid outlet 3. A gas supply tube 34 is extended in the liquid supply tube 33 coaxially therewith. Thus, the atomizing unit B has a three-tube construction. The shapes of a section b–c of the atomizing unit B and the accelerating unit A (section a–b) are the same as those of the corresponding portions of the two-fluid cleaning jet nozzle 20 in the second embodiment shown in FIG. 11.

In the two-fluid cleaning jet nozzle 30, a section c–d of the atomizing unit B (having section b–d ) has a portion of the atomizing tube 32 through which the gas for atomizing the liquid flows, a front end portion of the liquid supply tube 33 inserted through the wall of the atomizing tube 32 into the bore thereof to supply liquid, and a front end portion of the gas supply tube 34 inserted through the wall of the liquid supply tube 33 into the bore thereof to supply gas. The front end portions of the liquid supply tube 33 and the gas supply tube 34 extend with their axes in parallel to the axis of the atomizing tube 32.

A portion of the atomizing tube 32 corresponding to the section c–d, similarly to the corresponding portion of the two-fluid cleaning jet nozzle 20 in the second embodiment, is expanded so that the sectional area of an annular space between the same portion of the atomizing tube 32 and the front end portion of the liquid supply tube 33 is greater than that of the bore of the accelerating tube 31 corresponding to a section a–b. The liquid supplied through the liquid supply tube 33 is atomized into liquid droplets by the gas supplied through the gas supply tube 34 in the vicinity of the tip of the gas supply tube 34, and the liquid droplets are further atomized into smaller liquid droplets by the gas in the atomizing tube 32.

Therefore, the two-fluid cleaning jet nozzle 30 is able to atomize the liquid into droplets smaller than those atomized by the two-fluid cleaning jet nozzle 10 shown in FIG. 1 or the two-fluid cleaning jet nozzle 20 shown in FIG. 11, and is able to jet the liquid droplets at a high jetting velocity. Specifically, the respective particle sizes of the droplets atomized by the conventional two-fluid cleaning jet nozzle 70, the two-fluid cleaning jet nozzle 10 in the first embodiment shown in FIG. 1, the two-fluid cleaning jet nozzle 20 in the second embodiment shown in FIG. 11 and the two-fluid cleaning jet nozzle 30 in the third embodiment shown in Fig. 12 are about 20 $\mu$m, about 10 $\mu$m, about 5 $\mu$m and about 2 $\mu$m, respectively. Therefore, the cleaning ability of the two-fluid cleaning jet nozzle 30 in the third embodiment is higher than those of the conventional two-fluid cleaning jet nozzle 70 and the two-fluid cleaning jet nozzle 10 or 20 of the present invention shown in FIG. 1 or 11.

Fourth Embodiment

Figure 13:
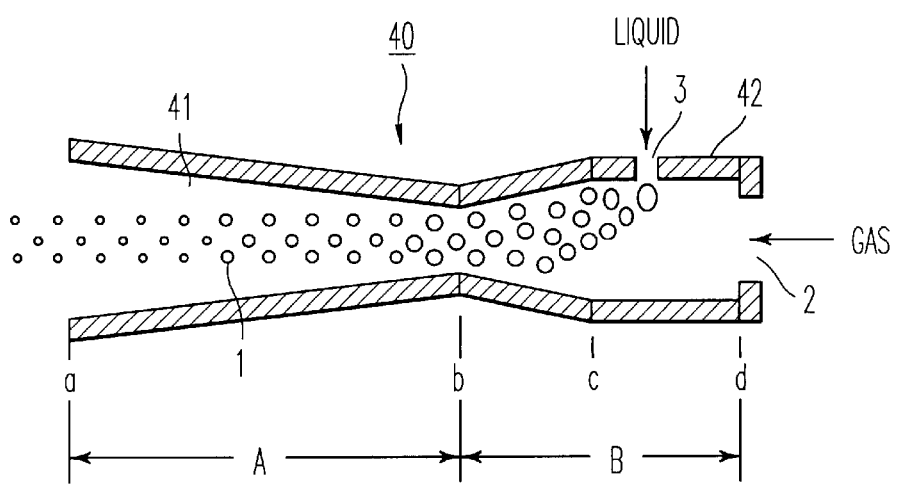
FIG. 13 shows a two-fluid cleaning jet nozzle in a fourth embodiment according to the present invention in a longitudinal sectional view.

FIG. 13 shows a two-fluid cleaning jet nozzle 40 in a fourth embodiment according to the present invention in a longitudinal sectional view.

The two-fluid cleaning jet nozzle 40 has an accelerating unit A (section a–b) provided with an accelerating tube 41 having the shape of a Laval nozzle, and an atomizing unit B (section b–d) provided with an atomizing tube 42 in which a pressurized liquid is atomized by pressurized gas. The atomizing tube 42 is provided with a gas inlet 2 and a liquid inlet 3.

A portion of the atomizing tube 42 of the atomizing unit B in section b–c has the same shape as the corresponding portion of the atomizing tube 22 of the two-fluid cleaning jet nozzle 20 shown in FIG. 11, and a portion of the atomizing tube 42 of the atomizing unit B in section c–d has the same shape as a portion in the section b–c of the atomizing tube 12 of the atomizing unit B of the two-fluid cleaning jet nozzle 10 shown in FIG. 1.

In the two-fluid cleaning jet nozzle 40, the accelerating tube 41 of the accelerating unit A (section a–b) has the shape of a Laval nozzle, gradually diverging toward its liquid droplet jetting end. The length of the accelerating tube 41 of the accelerating unit A (section a–b) is in the range of 30 to 200 mm for the same reasons as those determining the length of the atomizing tube 11 of the two-fluid cleaning jet nozzle 10 in the first embodiment. The sectional area of a nozzle throat, i.e., the portion corresponding to the position b in FIG. 13, in the atomizing tube 41 of the accelerating unit A must be 3 $mm^2$ or more for the same reasons as those determining the minimum sectional area of the bore of the accelerating tube 11 of the two-fluid cleaning jet nozzle 10 in the first embodiment. Practically, the sectional area of the nozzle throat is in the range of 3 to 10 $mm^2$. The sectional area of the bore of the atomizing tube 41 at the liquid droplet jetting end corresponding to the position a in FIG. 13 must be greater than that of the nozzle throat, i.e., greater than 3 mm². Practically, the sectional area of the bore of the atomizing tube 41 at the liquid droplet jetting end is in the range of 6 to 20 mm².

Generally, a Laval nozzle is used for accelerating a gas to a supersonic speed. In the two-fluid cleaning jet nozzle 40, the shape of the atomizing tube 41 is optimized to accelerate liquid droplets to a supersonic speed. It is known from FIG. 7 that the flow rate of the liquid must be 100 ml/min or more to achieve contaminant removal at a satisfactory contaminant removal ratio. An excessively high flow rate increases the running cost and is economically disadvantageous, and hence an optimum flow rate of the liquid is in the range of 100 to 300 ml/min. If the liquid is supplied at a flow rate in that range, the gas must be supplied at a flow rate in the range of 200 to 600 ml/min.

The sectional area of the throat of the accelerating tube 41 of the two-fluid cleaning jet nozzle 40 must be in the range of 3 to 10 mm² or greater to secure the necessary flow rate when the supply pressure of the gas is 7 kgf/cm² at a maximum. Since liquid droplets can be accelerated to a supersonic speed if the sectional area of the bore of the accelerating tube 41 at the liquid droplet jetting end corresponding to the position a is twice the sectional area of the nozzle throat, an optimum sectional area of the bore of the accelerating tube 41 at the liquid droplet jetting end is in the range of 6 to 20 mm². When the two-fluid cleaning jet nozzle 40 meets the foregoing conditions, liquid droplets 1 can be jetted at a jetting speed of about 500 m/s, which is about 1.5 times the sound velocity.

The cleaning ability of the two-fluid cleaning jet nozzle 40 capable of jetting the liquid droplets 1 at a supersonic speed is higher than those of a nozzle for ice scrubber cleaning, the conventional two-fluid cleaning jet nozzle 70 and the two-fluid cleaning jet nozzles 10, 20 and 30 of the present invention shown in FIGS. 1, 11 and 12.

Fifth Embodiment

Figure 14:
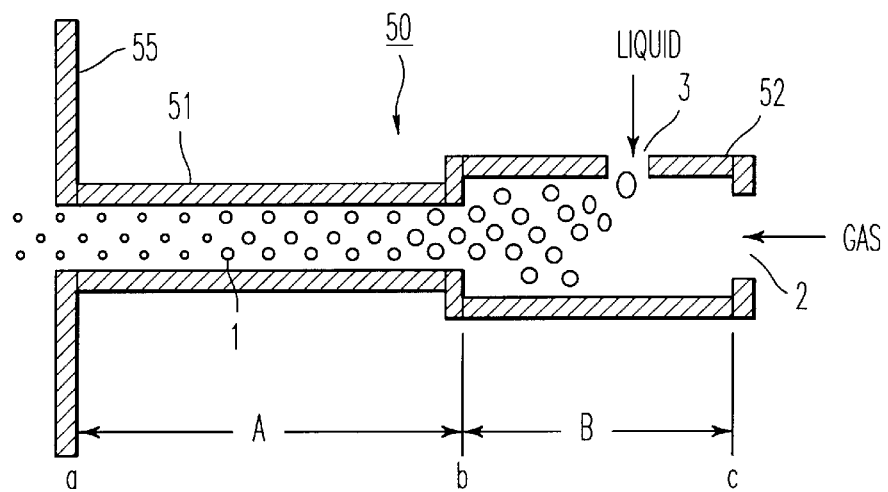
FIG. 14 is a longitudinal sectional view of a two-fluid cleaning jet nozzle in a fifth embodiment according to the present invention.

FIG. 14 is a longitudinal sectional view of a two-fluid cleaning jet nozzle 50 in a fifth embodiment according to the present invention.

The two-fluid cleaning jet nozzle 50 has an accelerating unit A (section a–b) provided with an accelerating tube 51, and an atomizing unit B (section b–d) provided with an atomizing tube 52 in which a pressurized liquid is atomized by a pressurized gas. The atomizing tube 52 is provided with a gas inlet 2 through which the pressurized gas is supplied into the atomizing tube 52, and a liquid inlet 3 through which the liquid is supplied into the atomizing tube 52. The respective shapes of the accelerating unit A (section a–b) and the atomizing unit B (section b–c) of the two-fluid cleaning jet nozzle 50 are the same as those of the accelerating unit A and the atomizing unit B of the two-fluid cleaning jet nozzle 10 shown in FIG. 1.

The two-fluid cleaning jet nozzle 50 has a baffle 55 attached to the liquid droplet jetting end of the accelerating tube 51 corresponding to a position a in FIG. 14 or a portion of the accelerating tube 41 in a section a–b in FIG. 14 to control the direction of jets of the gas and the liquid droplets. The baffle 55 is a flat plate extending by a distance in the range of 10 to 100 mm from the accelerating tube 51 of the two-fluid cleaning jet nozzle 50 in a direction perpendicular to a liquid droplet jetting direction, e.g., a circular plate of 50 mm radius.

Figure 15:
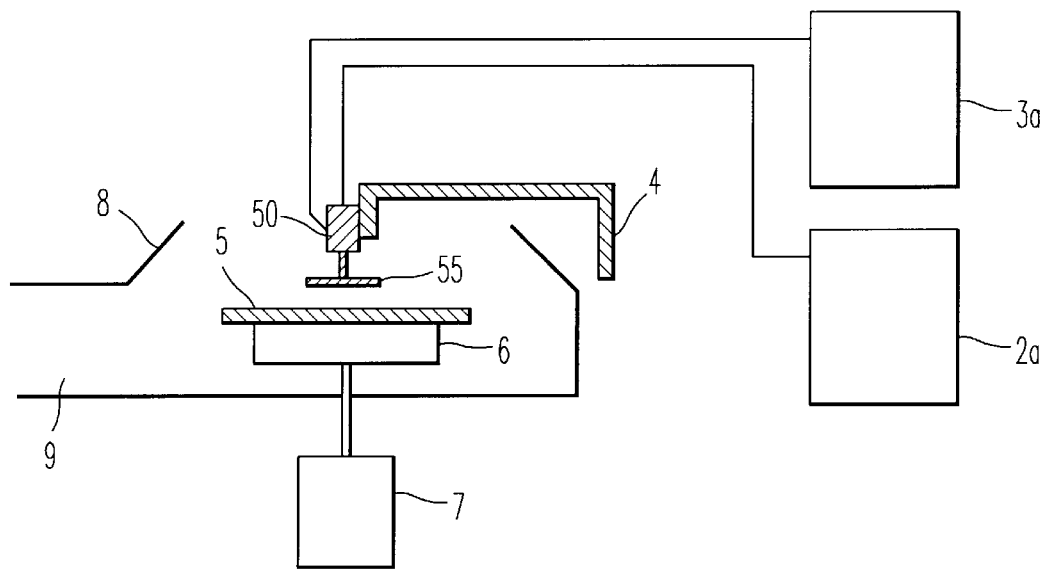
FIG. 15 is a typical view of a cleaning apparatus provided with the two-fluid cleaning jet nozzle for cleaning, for example, semiconductor wafers.

FIG. 15 is a typical view of a cleaning apparatus and cleaning method provided with the two-fluid cleaning jet nozzle 50 for cleaning, for example, semiconductor wafers. The cleaning apparatus has a gas supply unit 2a for pressurizing a gas and supplying the pressurized gas to the two-fluid cleaning jet nozzle 50, a liquid supply unit 3a for pressurizing a liquid and supplying the pressurized liquid to the two-fluid cleaning jet nozzle 50, a stage 6 for fixedly supporting a semiconductor wafer 5, a motor 7 for rotating the stage 6, a process cup 8 for preventing the liquid droplets from scattering during a cleaning operation, a discharge duct 9 joined to the process cup 8, and an industrial robot having a robot arm 4 for holding and moving the two-fluid cleaning jet nozzle 50.

During a cleaning operation, the two-fluid cleaning jet nozzle 50 is disposed with the baffle 55 spaced a distance in the range of 5 to 50 mm, preferably 20 mm from the surface of the semiconductor wafer 5 and extending substantially in parallel to the surface of the semiconductor wafer 5, and is moved horizontally along the surface of the semiconductor wafer 5 to clean the surface thereof Jets of liquid droplets 1 and the gas jetted by the two-fluid cleaning jet nozzle 50 impinge on the surface of the semiconductor wafer 5 and are scattered upward. The baffle 55 stops the scattering liquid droplets so that the liquid droplets 1 and the gas disperse along the surface of the semiconductor wafer 5. Although the liquid droplets 1 and the gas are jetted in jets of a high velocity, the velocity of the jets is decreased by the baffle 55 as the jets spread toward the periphery of the baffle 55. Specifically, when the length of the accelerating tube 51 of the accelerating unit A (section a–b) is 100 mm, the sectional area of the bore of the accelerating tube 51 is 7 mm², the flow rate of the gas is 150 l/min and the flow rate of the liquid is 100 ml/min, the velocity of the jets at the exit of the accelerating tube 51 is 330 m/s, which is approximately equal to the sound velocity, and the velocity of the jets at the periphery of the baffle 55 is 0.4 m/s. If the two-fluid cleaning jet nozzle 50 is not provided with a baffle, jets of the gas and the liquid droplets jetted by the two-fluid cleaning jet nozzle 50 are repelled back by the surface of the semiconductor wafer 5 and scatter upward. Contaminants removed from the surface of the semiconductor wafer 5 by the impact of the liquid droplets scatter upward together with the liquid droplets and then adhere again to the surface of the semiconductor wafer 5 to contaminate the semiconductor wafer 5 again. Therefore,if the two-fluid cleaning jet nozzle 50 isn't provided with a baffle, the two-fluid cleaning jet nozzle 50 must be held with its axis inclined at an angle of 60° or less to the surface of t he semiconductor wafer 5, and the process cup 8 must be evacuated at a high rate to quickly expel the jets of gas, the liquid droplets and the removed contaminants.

The baffle 55 solves the problem of secondary contamination of the semiconductor wafer 5. Therefore, the two-fluid cleaning jet nozzle 50 may be held in a vertical position and hence the two-fluid cleaning jet nozzle 50 is able to exert a high cleaning force on contaminants. Since the velocity of the jets decreases toward the periphery of the baffle 55, the process cup 8 may be evacuated at a relatively low discharge rate. Concretely, whereas the process cup 8 needs to be evacuated at a discharge rate of about 5 m³/min or more when the conventional two-fluid cleaning jet nozzle 70 shown in FIG. 18 is employed, the process cup 8 needs to be evacuated at a discharge rate of 2 m³/min at the most when the two-fluid cleaning jet nozzle 50 of the present invention is employed.

The effect of the baffle 55 on suppressing the scatter of jets is reduced if the baffle 55 is spaced excessively from the surface of the semiconductor wafer 5. If the baffle 55 is excessively close to the surface of the semiconductor wafer 5, the flow resistance in the space between the baffle 55 and the surface of the semiconductor wafer 5 is high, and hence the liquid droplet jetting velocity is reduced. Therefore, it is desirable to space the baffle 55 from the surface of the semiconductor wafer 5 by a distance in the range of 5 to 50 mm. If the diameter of the baffle 55 having the shape of a circular plate is excessively small, the effect of the baffle 55 on preventing the scatter of the jets is insignificant. If the diameter of the baffle 55 is excessively great, problems arise in the construction of the cleaning apparatus and the movement of the robot arm 4. Therefore, an appropriate radius of the baffle 55 having the shape of a circular plate is in the range of 10 to 100 mm.

Sixth Embodiment

Figure 16A:
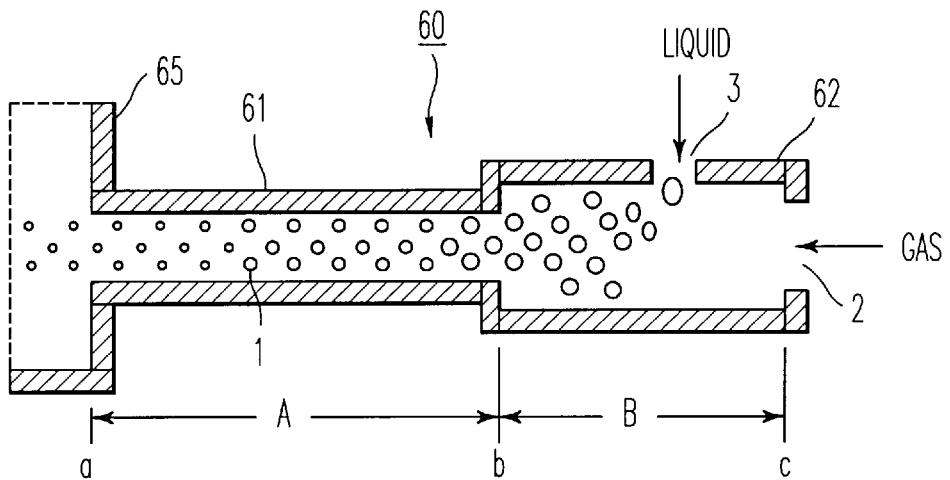
FIGS. 16(a), 16(b) and 16(c) are sectional views of a two-fluid cleaning jet nozzle in a sixth embodiment according to the present invention.
Figure 16B:
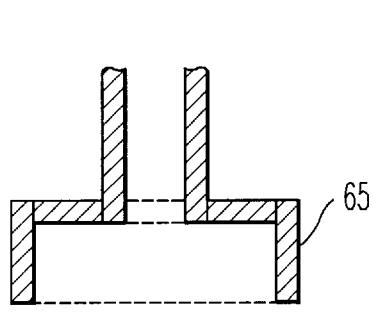
Figure 16C:
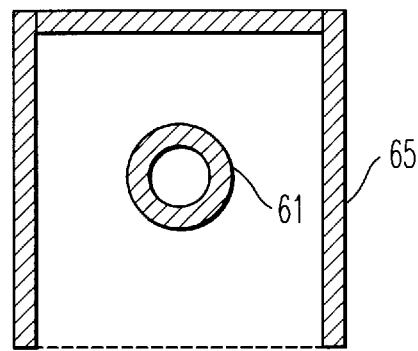
Figure 17:
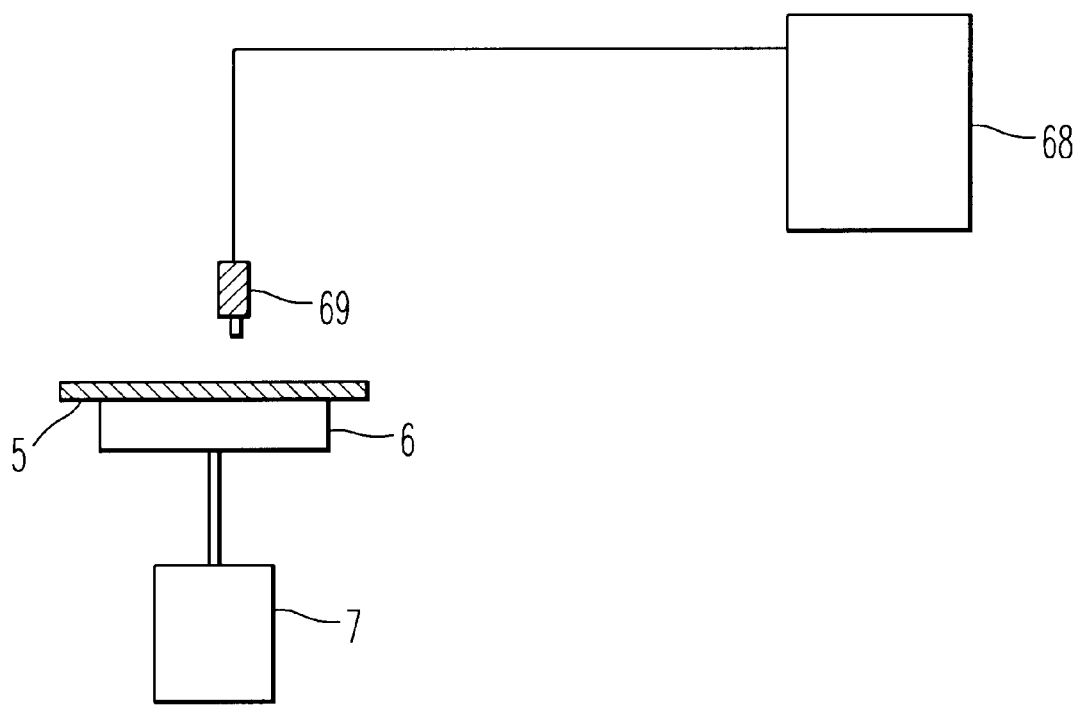
FIG. 17 is a schematic view of a conventional high-pressure jet cleaning apparatus.

FIGS. 16(a), 16(b) and 16(c) are sectional views of a two-fluid cleaning jet nozzle 60 in a sixth embodiment according to the present invention. The two-fluid cleaning jet nozzle 60 has an accelerating unit A (section a–b) provided with an accelerating tube 61, an atomizing unit B (section b–d) provided with an atomizing tube 62, and a baffle 65 attached to the jetting end of the accelerating tube 61. The atomizing tube 62 is provided with a gas inlet 2 through which pressurized gas is supplied into the atomizing tube 62, and a liquid inlet 3 through which a liquid is supplied into the atomizing tube 62. The respective shapes of the accelerating unit A (section a–b) and the atomizing unit B (section b–c) are the same as those of the two-fluid cleaning jet nozzle 50 of the present invention shown in FIG. 14.

FIG. 16(b) is a cross-sectional view of a baffle 65 taken on a plane perpendicular to the paper in FIG. 16(a), and FIG. 16(c) is an end view of the two-fluid cleaning jet nozzle 60 taken in a direction opposite a liquid droplet jetting direction.

The baffle 65 of the two-fluid cleaning jet nozzle 60 has the shape of a box having one open side and an open end opening in the liquid droplet jetting direction. The open side of the baffle 65 is directed toward the inlet opening of the discharge duct 9. The velocity of air jetted by the nozzle 60 is relatively low in the vicinity of the baffle 65 and most of the jetted air flows through the open side of the baffle 65 toward the discharge duct 9, which improves discharge efficiency and hence the discharge may be reduced. Thus, the baffle 65 placed at or near the jetting end of the two-fluid cleaning jet nozzle 60 to stop the jets of gas and liquid droplets repelled back by the surface of a workpiece such as a semiconductor wafer improves discharge efficiency, and hence the cleaning effect is satisfactory even if discharge rate is low.

The effects and advantages of the present invention are as follows.

As has been described in detail, in the two-fluid cleaning jet nozzle according to the present invention, the sectional area of the narrowest portion of the bore of the atomizing tube is greater than that of the narrowest portion of the bore of the accelerating tube. Therefore, the two-fluid cleaning jet nozzle is able to jet liquid droplets at a high jetting velocity even if the pressure of the pressurized gas is relatively low, to achieve powerful cleaning.

The accelerating tube having the shape of a round straight tube and optimum dimensions is capable of jetting the liquid droplets at a higher jetting velocity.

The accelerating tube of the two-fluid cleaning jet nozzle of the present invention having the shape of a Laval nozzle diverging from a portion joined to the atomizing tube toward the jetting end thereof and optimum dimensions is capable of jetting liquid droplets at a supersonic jetting velocity.

In the two-fluid cleaning jet nozzle of the present invention, the atomizing tube has a cylindrical shape of optimum dimensions. Therefore, the liquid can be atomized as optimum liquid droplets to enhance the cleaning effect of the liquid droplets.

In the two-fluid cleaning jet nozzle of the present invention, the atomizing tube is tapered so that the sectional area of the bore thereof decreases gradually toward the joint of the atomizing tube and the accelerating tube, and the atomizing tube is formed in optimum dimensions. Therefore, fine liquid droplets can be produced and jetted at a high jetting velocity.

In the two-fluid cleaning jet nozzle of the present invention, the gas inlet and the liquid inlet of the atomizing tube are formed with optimum sectional areas, and so the liquid can effectively be atomized as fine liquid droplets to enhance the cleaning effect.

In the two-fluid cleaning jet nozzle of the present invention, the atomizing unit has a two-tube construction consisting of a portion of the atomizing tube into which the pressurized gas is supplied, and the front end portion of the liquid supply tube through which the liquid is supplied into the atomizing tube in the flowing direction of the gas. Therefore, the liquid can effectively be atomized in fine liquid droplets to enhance the cleaning effect.

In the atomizing unit having a three-tube construction, the liquid can effectively be atomized in fine liquid droplets and the fine liquid droplets can be further atomized in finer liquid droplets.

In the two-fluid cleaning jet nozzle having the baffle, contaminants adhering to the surface of a workpiece such as a semiconductor wafer can be removed without damaging the surface of the workpiece.

The cleaning apparatus employing the two-fluid cleaning jet nozzle of the present invention is capable of effective contaminant removal. When the cleaning apparatus is provided with a baffle, the scatter of liquid droplets can be prevented and the process cup may be evacuated at a low discharge rate.

In the cleaning apparatus of the present invention, the respective supply pressures of the gas and the liquid are selectively determined. Therefore, the cleaning apparatus employing the two-fluid cleaning jet nozzle of the present invention is able to provide effective cleaning.

Obviously, numerous additional modifications and variations of the present invention are possible in light of the above teachings. It is therefore to be understood that within the scope of the appended claims, the invention may be practiced otherwise than as specifically described herein.

What is claimed is:

1. A two-fluid cleaning jet nozzle comprising:
   an atomizing unit using pressurized air for atomizing a pressurized liquid into liquid droplets; and
   an accelerating unit for jetting said liquid droplets out of the nozzle,
   wherein a sectional area of the narrowest portion of a gas passage in said atomizing unit is greater than a sectional area of the narrowest portion of a fluid passage in said accelerating unit.

2. The two-fluid cleaning jet nozzle according to claim 1, wherein said accelerating unit has a straight tube having a bore of a circular cross section.

3. The two-fluid cleaning jet nozzle according to claim 1, wherein said accelerating unit has a straight tube of a length in the range of 30 to 200 mm, having a bore of at least 3 mm$^2$ in sectional area.

4. The two-fluid cleaning jet nozzle according to claim 1, wherein said bore of the straight tube of said accelerating unit diverges gradually from an end joined to said atomizing unit to form a Laval nozzle.

5. The two-fluid cleaning jet nozzle according to claim 4, wherein said straight tube of said accelerating unit has a length in the range of 30 to 200 mm, and has a nozzle throat of a sectional area of at least 3 mm$^2$.

6. The two-fluid cleaning jet nozzle according to claim 1, wherein said atomizing unit has a cylindrical shape.

7. The two-fluid cleaning jet nozzle according to claim 1, wherein said atomizing unit has a shape converging toward an thereof end joined to said accelerating unit.

8. The two-fluid cleaning jet nozzle according to claim 1, wherein said atomizing unit has a first tube for conducting the gas, and a second tube for jetting the liquid into said first tube in the flowing direction of the gas.

9. The two-fluid cleaning jet nozzle according to claim 8, wherein the flowing direction of the gas in said first tube and the flowing direction of the liquid in said second tube are the same as a direction in which the liquid droplets are jetted.

10. The two-fluid cleaning jet nozzle according to claim 1, wherein the sectional area of a gas inlet through which the gas is supplied into said atomizing unit is greater than the sectional area of the bore of said accelerating tube.

11. The two-fluid cleaning jet nozzle according to claim 1, including a baffle at an outlet end of said accelerating unit, said baffle extending substantially perpendicularly to the liquid droplet jetting direction.

12. The nozzle of claim 1, wherein said atomizing unit is not supplied with an abrasive.

13. The nozzle of claim 1, wherein said atomizing unit is supplied with pure water as the pressurized liquid.

14. A cleaning apparatus comprising:
  a two-fluid cleaning jet nozzle comprising an atomizing unit using pressurized air for atomizing a pressurized liquid into liquid droplets, and an accelerating unit for jetting said liquid droplets out of the nozzle, wherein a sectional area of the narrowest portion of a gas passage in said atomizing unit is greater than a sectional area of the narrowest portion of a fluid passage in said accelerating unit;
  a gas supply means connected to said atomizing unit to supply compressed gas into said atomizing unit; and
  a liquid supply means connected to said atomizing unit to supply the pressurized liquid into said atomizing unit.

15. The cleaning apparatus according to claim 14, wherein said two-fluid cleaning jet nozzle is disposed with a front end of the accelerating unit spaced a distance in the range of 5 to 50 mm from the surface of a workpiece to be cleaned.

16. The cleaning apparatus of claim 14, wherein said atomizing unit is not supplied with an abrasive.

17. The cleaning apparatus of claim 14, wherein said atomizing unit is supplied with pure water as the pressurized liquid.

18. A two-fluid cleaning jet nozzle, comprising:
  an atomizing unit using pressurized air for atomizing a pressurized liquid into liquid droplets; and
  an accelerating unit for jetting said liquid droplets out of the nozzle,
  wherein a sectional area of the narrowest portion of a gas passage in said atomizing unit is greater than a sectional area of the narrowest portion of a fluid passage in said accelerating unit, wherein said atomizing unit has a first tube for conducting the gas, a second tube disposed in said first tube to jet the liquid, and a third tube disposed in said second tube to jet the gas.

19. The two-fluid cleaning jet nozzle according to claim 18, wherein the flowing direction of the gas in said first and third tube and the flowing direction of the liquid in said second tube are the same as a direction in which the liquid droplets are jetted.

20. A cleaning method of a workpiece, using a two-fluid cleaning jet nozzle having an atomizing unit using pressurized gas for atomizing a pressurized liquid into liquid droplets, and an accelerating unit for jetting said liquid droplets out of the nozzle, wherein a sectional area of the narrowest portion of a gas passage in said atomizing unit is greater than a sectional area of the narrowest portion of a fluid passage in said accelerating unit, the method comprising the steps of:
  supplying a compressed gas into the atomizing unit from a gas supply means connected to said atomizing unit;
  supplying the pressurized liquid into said atomizing unit from a liquid supply means;
  atomizing the liquid in the atomizing unit to form a gas mixed with liquid droplets; and
  jetting the gas mixed with the liquid droplets from said two-fluid cleaning jet nozzle to impinge on the workpiece.

21. The cleaning method according to claim 20, wherein the gas and the liquid are supplied to said two-fluid cleaning jet nozzle at a pressure in the range of 1 to 10 kgf cm$^2$.

22. The cleaning method of claim 20, wherein the pressurized liquid is pure water.

23. The cleaning method of claim 20, wherein said atomizing unit is not supplied with an abrasive.

* * * * *